United States Patent
Ortega Espluga et al.

(10) Patent No.: US 11,050,439 B2
(45) Date of Patent: Jun. 29, 2021

(54) LDPC CODING WITH DIFFERENTIATED PROTECTION

(71) Applicants: THALES, Courbevoie (FR); CENTRE NATIONAL D'ETUDES SPATIALES, Paris (FR); CENTRE NATIONAL DE LA RECHERCHE SCIENTIFIQUE, Paris (FR); INSTITUT NATIONAL POLYTECHNIQUE DE TOULOUSE, Toulouse (FR); TESA TELECOM SPATIALES AERONAUTIQUES, Toulouse (FR)

(72) Inventors: Lorenzo Ortega Espluga, Toulouse (FR); Charly Poulliat, Toulouse (FR); Hanaa Al Bitar, Toulouse (FR); Marie-Laure Boucheret, Toulouse (FR); Marion Aubault, Toulouse (FR)

(73) Assignees: THALES, Courbevoie (FR); CENTRE NATIONAL D'ETUDES SPATIALES, Paris (FR); CENTRE NATIONAL DE LA RECHERCHE SCIENTIFIQUE, Paris (FR); INSTITUT NATIONAL POLYTECHNIQUE DE TOULOUSE, Toulouse (FR); TESA TELECOM SPATIALES AERONAUTIQUES, Toulouse (FR)

( * ) Notice: Subject to any disclaimer, the term of this patent is extended or adjusted under 35 U.S.C. 154(b) by 0 days.

(21) Appl. No.: 16/897,814

(22) Filed: Jun. 10, 2020

(65) Prior Publication Data
US 2020/0395958 A1 Dec. 17, 2020

(30) Foreign Application Priority Data

Jun. 13, 2019 (FR) ........................................ 1906291

(51) Int. Cl.
| | |
|---|---|
| G06F 11/00 | (2006.01) |
| G08C 25/00 | (2006.01) |
| G06F 11/30 | (2006.01) |
| H03M 13/00 | (2006.01) |
| H04L 1/00 | (2006.01) |

(Continued)

(52) U.S. Cl.
CPC ... *H03M 13/1148* (2013.01); *H03M 13/2903* (2013.01); *H03M 13/2906* (2013.01); *H03M 13/356* (2013.01)

(58) Field of Classification Search
CPC ......... H03M 13/1148; H03M 13/2903; H03M 13/2906; H03M 13/356
See application file for complete search history.

(56) References Cited

FOREIGN PATENT DOCUMENTS

| | | |
|---|---|---|
| FR | 3 035 286 A1 | 10/2016 |
| WO | WO-2016168991 A1 * | 10/2016 ............... H03M 1/10 |

OTHER PUBLICATIONS

Poulliat, et al., "Enhancement of Unequal Error Protection Properties of LDPC Codes", EURASIP Journal on Wireless Communications and Networking, vol. 2007, Article ID 92659, 9 pages, 2007.

(Continued)

*Primary Examiner* — Samir W Rizk
(74) *Attorney, Agent, or Firm* — BakerHostetler

(57) ABSTRACT

A new unequal-error-protection method that is based on using a particular parity-check-matrix structure for LDPC codes.

9 Claims, 5 Drawing Sheets

(51) Int. Cl.
*H03M 13/11* (2006.01)
*H03M 13/29* (2006.01)
*H03M 13/35* (2006.01)

(56) References Cited

OTHER PUBLICATIONS

Pulini, et al., "Unequal Diversity LDPC Codes for Relay Channels", IEEE Trans. On Wireless Communications, vol. 12, No. 11, Nov. 2013.
Lamy-Bergot, et al., "Embedding protection inside H.264/AVC and SVC streams", EURASIP Journal on Wireless Communications and Networking, 2010.
Poulliat, "Contribution à l'étude et à l'optimisation de systèmes à composantes itératives", HdR 2011.
Boutros, et al., "Low-Density Parity-Check Codes for Nonergodic Block-Fading Channels", IEEE Transactions on Information Theory, vol. 56, No. 9, pp. 4286-4300, Sep. 2010.
Roudier, "GNSS Signal Demodulation Performance in Urban Environments", Theses, INP Toulouse, Jan. 2015.
Rahnavard, et al., "New results on unequal error protection using LDPC codes", IEEE Communications Letters, vol. 10, No. 1, pp. 43-45, Jan. 1, 2006.
Ricciutelli, et al., "LDPC coded modulation schemes with largely unequal error protection", 2015 IEEE International Black Sea Conference on Communications and Networking (BlackSeaCom), pp. 48-52, May 18, 2015.
Wu, et al., "A new construction of UEP QC-LDPC codes", 2010 IEEE International Symposium on Information Theory, pp. 849-853, Jun. 13, 2010.
Kumar, et al., "On unequal error protection LDPC codes based on plotkin-type constructions", IEEE Global Telecommunications Conference, vol. 1, pp. 493-497, Nov. 29, 2004.
Jia, et al., "LDPC Coded Irregular Modulation Based on Degree Distribution", 2007 International Conference on Wireless Communications, Networking and Mobile Computing, pp. 873-876, Sep. 21, 2007.

\* cited by examiner

LDPC CODING WITH DIFFERENTIATED PROTECTION

CROSS-REFERENCE TO RELATED APPLICATIONS

This application claims priority to foreign French patent application No. FR 1906291, filed on Jun. 13, 2019, the disclosure of which is incorporated by reference in its entirety.

FIELD OF THE INVENTION

The invention relates to the field of digital telecommunications and more precisely to the field of channel coding, which relates to the use of correction codes with the aim of increasing the level of redundancy of the transmitted information so as to be able to reconstruct the initially generated message despite errors introduced during the transmission of this message through an imperfect propagation channel.

The invention more particularly relates to the field of the correction codes known as low-density parity codes (LDPC) and concerns a coding method allowing, depending on priority level, differentiated protection to be applied to the data to be transmitted. To this end, the invention provides a particular LDPC parity-check-matrix structure.

BACKGROUND

The invention advantageously applies to satellite-radionavigation standards or GNSS standards (GNSS being the acronym of global navigation satellite system) such as the GPS or Galileo standards.

GNSS standards define GNSS messages that are transmitted via data frames. Such messages contain data relating to position information such as satellite ephemerides, information on the clock of the satellite, service data or even integrity data.

In current standards, these data are protected by a simple correction code that is applied directly to the entirety of a data frame. This method has the drawback of not allowing a precise optimization of the compromise between the bandwidth consumed by the addition of the correction code and the required level of protection.

Specifically, the data transmitted in a GNSS frame are of diverse natures and may be classified into a plurality of groups having different priority levels. By priority level what is meant here is a priority level with respect to the criticality of the data to be transmitted. Certain data are more important than others and therefore require a higher correction-coding protection level to ensure their correct transmission with a reliability level compatible with the priority level. Moreover, certain critical data need to be transmitted faster than others.

The invention may be applied in a similar way to other data-transmitting systems in which it is possible to group the data into a plurality of sets having different priority levels.

A general method for protecting digital data to be transmitted comprising a plurality of priority levels consists in implementing differentiated coding or unequal protection coding. This method allows the protection of the data and/or the time required to demodulate them to be optimized depending on the level of importance of the data.

Conventionally, there are two ways of achieving unequal protection of data with an error-correction code.

A first solution, which is for example described in references [1] and [2], consists in constructing specific correction codes the natural structure of which includes various classes of protection.

These techniques are in general applicable solely to frames of large size (of about 4000 bits), this being incompatible with GNSS applications because of the latency imposed by these large sizes. Moreover, certain methods, such as that described in reference [2], propose a code structure based on the particular assumption of relayed (or interactive) communications, allowing diversity with respect to fading to be guaranteed reception-end. These assumptions are constraining and do not always correspond to the targeted application.

Another method, described in reference [3], consists in applying different coding rates depending on the data that it is sought to transmit in the application level. This technique, although effective, also has a number of drawbacks. Firstly, this method requires a substantial amount of signalling (in the application layer) of the various classes of bits that it is sought to protect, this increasing inter-layer signalling cost. Moreover, this means that there are a plurality of classes of data rates from a point of view of the lower layers, this being difficult to manage in satellite transmission applications.

Lastly, all of these techniques have a common fault. They induce an often large difference in performance between the most protected bits and the least protected bits. This means that the least important bits are hardly protected at all, this not always been desirable in the targeted application.

Patent application FR3035286 of the Applicant allows this problem to be addressed, but uses two types of code, an internal code and an external code. The internal code is applied to data bits that are judged to be higher priority than the others.

SUMMARY OF THE INVENTION

The invention provides a new unequal-error-protection method that is based on using a particular parity-check-matrix structure for LDPC codes.

A message encoded using this matrix allows data protected with two priority levels to be generated. Reception-end, priority data may be decoded with a lower probability of error but also more rapidly because it is not necessary to receive the entirety of the coded frame to be able to decode priority bits.

One subject of the invention is a method for encoding a binary message composed of a first sub-message having a first priority level and of a second sub-message having a second priority level, using an LDPC code defined by a parity-check matrix H having a first dimension corresponding to the bits of the coded binary message and a second dimension, the parity-check matrix H consisting of four sub-sets of two sub-matrices that are concatenated in the second dimension, the four sub-sets being concatenated in the first dimension, the first sub-matrix of the first sub-set taking the form of

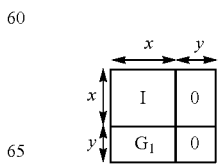

where x is equal to the size of half of the first sub-message, y is equal to the size of half of the second sub-message, I is an identity matrix of dimensions (x,x) and $G_1$ is a nonzero matrix of dimensions (x,y), the second sub-matrix of the first sub-set being a nonzero matrix, the first sub-matrix of the second sub-set being a zero matrix, the second sub-matrix of the second sub-set being a nonzero matrix, the first sub-matrix of the third sub-set being a nonzero matrix, the second sub-matrix of the third sub-set taking the form

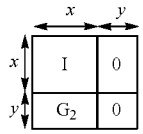

where $G_2$ is a nonzero matrix of dimensions (x,y), the first sub-matrix of the fourth sub-set being a nonzero matrix, and the second sub-matrix of the fourth sub-set being a zero matrix, the encoding method comprising a step of encoding the binary message using the parity-check matrix H to produce a coded binary message.

According to one particular aspect of the invention, the coded binary message is composed of two independent coded sub-messages each comprising data bits corresponding to one half of the first sub-message and to one half of the second sub-message and parity bits.

According to one particular aspect of the invention, the first sub-set is associated with a data-bit set consisting of a first half of the first sub-message and of a first half of the second sub-message, the second sub-set is associated with the parity bits corresponding to the first data-bit set, the third sub-set is associated with a second data-bit set consisting of a second half of the first sub-message and of a second half of the second sub-message and the fourth sub-set is associated with the parity bits corresponding to the second data-bit set.

According to one particular aspect of the invention, the second sub-matrix of the second sub-set and the first sub-matrix of the fourth sub-set are of maximum rank.

According to another particular aspect of the invention:
the second sub-matrix of the first sub-set and the first sub-matrix of the third sub-set have the same density of "1" values,
the second sub-matrix of the second sub-set and the first sub-matrix of the fourth sub-set have the same density of "1" values,
the sub-matrices $G_1$ and $G_2$ have the same density of "1" values.

According to one particular aspect of the invention, the sub-matrices of the four sub-sets are square and of dimensions (x+y,x+y).

Another subject of the invention is an encoding device comprising means configured to execute the method for encoding a binary message according to the invention.

Another subject of the invention is a transmitter comprising an encoding device according to the invention for encoding a binary message composed of a first sub-message having a first priority level and of a second sub-message having a second priority level, in order to produce a coded binary message composed of two independent coded sub-messages each comprising data bits corresponding to one half of the first sub-message and to one half of the second sub-message and parity bits, the transmitter comprising a transmitting means configured to transmit each of the two coded sub-messages independently.

Yet other subjects of the invention are a computer program containing instructions for executing the encoding method according to the invention, when the program is executed by a processor and a processor-readable storage medium on which is stored a program containing instructions for executing the encoding method according to the invention, when the program is executed by a processor.

BRIEF DESCRIPTION OF THE DRAWINGS

Other features and advantages of the present invention will become more clearly apparent on reading the following description with reference to the following appended drawings.

DETAILED DESCRIPTION

Figure 1:
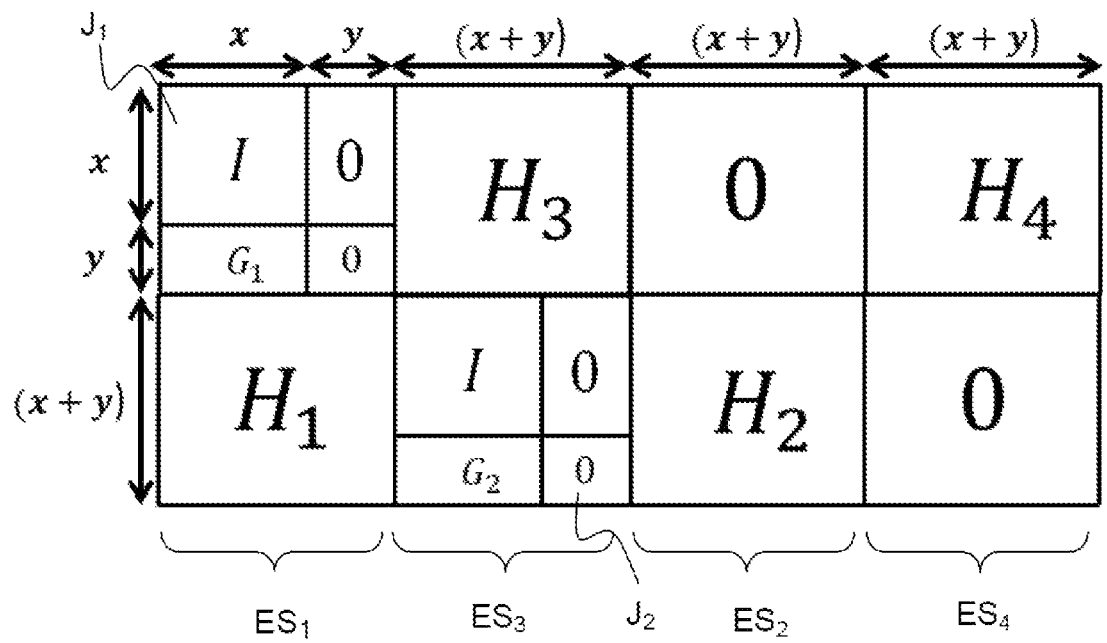
FIG. 1 shows the structure of a parity-check matrix of a correction code according to one embodiment of the invention.

The invention proposes a new structure for the parity-check matrix H of an LDPC correction code. This new structure is shown in FIG. 1. It allows two different protection levels to be applied to the data to be transmitted.

The structure of the matrix H is illustrated in FIG. 1. It is composed of four sets $ES_1, ES_2, ES_3, ES_4$ each composed of two sub-matrices that are concatenated in the vertical dimension. In total, the matrix H consists of eight square sub-matrices of dimensions (x+y; x+y). x and y are integer values that define the proportion of high-priority bits and of low-priority bits in the message to be coded. If the binary message to be coded is denoted M, this message is composed of 2x high-priority bits and 2y low-priority bits.

The first set $ES_1$ is composed of two sub-matrices $J_1$ and $H_1$. The second set $ES_2$ is composed of a zero matrix and of a sub-matrix $H_2$. The third set $ES_3$ is composed of two sub-matrices $H_3$ and $J_2$. The fourth set $ES_4$ is composed of a sub-matrix $H_4$ and of a zero matrix.

The sub-matrices $J_1$ et $J_2$ are of the form

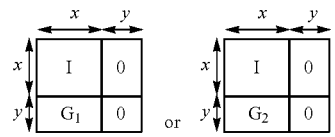

with I an identity matrix of dimensions (x,x) and $G_1$, $G_2$ a sub-matrix of dimensions (x,y). The other coefficients of the sub-matrices $J_1$ and $J_2$ are zero.

The sub-matrices $H_1$, $H_2$, $H_3$, $H_4$, $G_1$, $G_2$ are low-density matrices that are generated using optimization techniques, for example a density-evolution or EXIT-chart method as described in reference [7].

Figure 2:
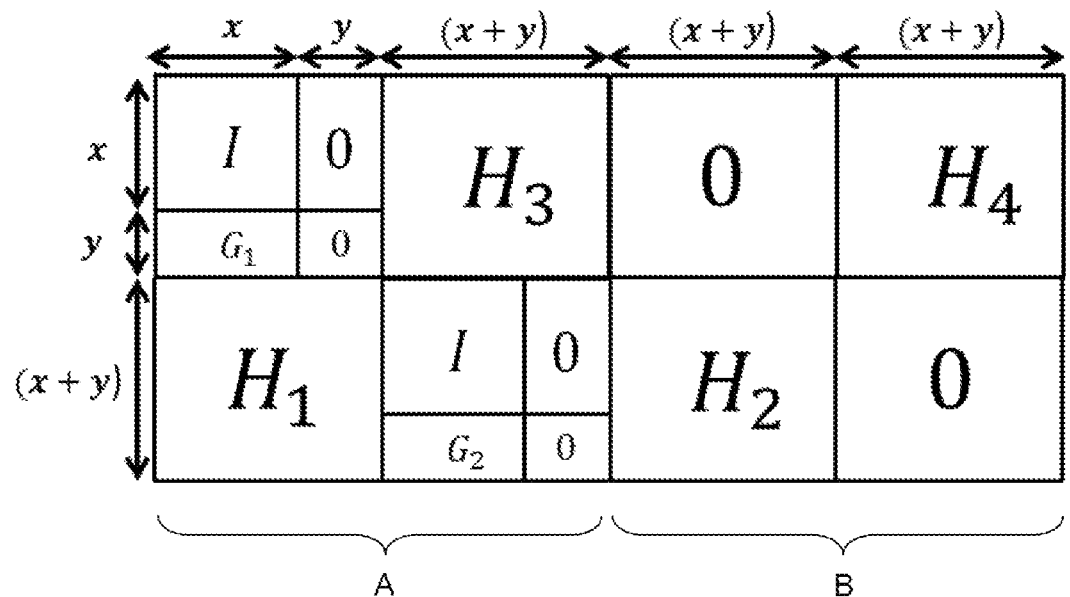
FIG. 2 shows the parity-check matrix of FIG. 1 in a systematic form.

FIG. 2 shows the parity-check matrix H in another form in which sets $ES_2$ and $ES_3$ have been permuted. Generally, the four sets of matrices may be permuted in any way without modifying the principle of the coding. The parity-check matrix H is shown in FIG. 2 in its systematic form. In other words, sub-matrix A (composed of the sets $ES_1$ and $ES_3$) corresponds to the data bits whereas sub-matrix B (composed of the sets $ES_2$ and $ES_4$) corresponds to the parity bits.

If the binary message to be coded is denoted M, the vector of the parity bits P is obtained using the following relationships:

$$AM^T = BP^T = 0 \quad \text{[Math. 1]}$$

$$P^T = AB^{-1}M^T \quad \text{[Math. 2]}$$

The sub-matrix B must be invertible and of maximum rank.

Figure 3:
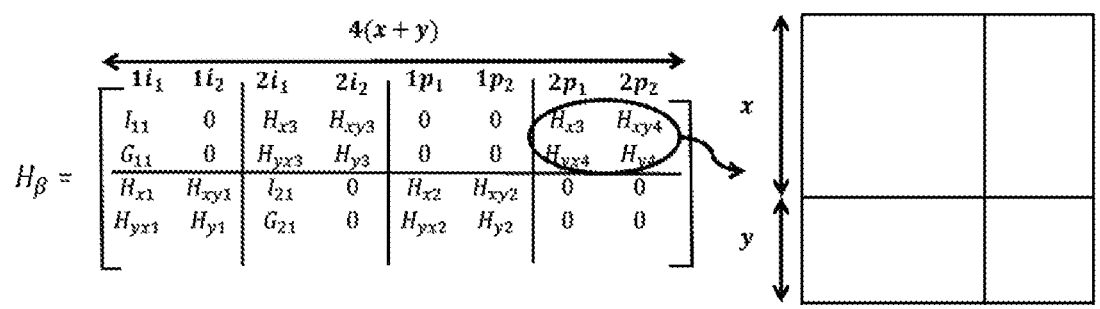
FIG. 3 shows the parity-check matrix of FIG. 2 with detail elements.

FIG. 3 shows yet another illustration of the parity-check matrix H. Each sub-matrix $H_1$, $H_2$, $H_3$, $H_4$ is composed of two square matrices of respective dimensions (x,x) and (y,y) and of two matrices of respective dimensions (x,y) and (y,x).

The parity-check matrix H comprises 4(x+y) columns and 2(x+y) rows.

Figure 4:
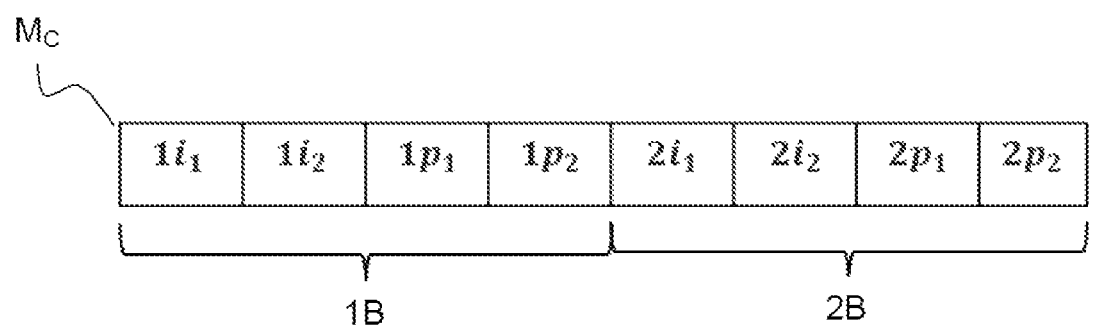
FIG. 4 shows an example of a structure of a message coded using a coding method according to the invention.

FIG. 4 schematically shows the structure of the coded message $M_c$ obtained after coding of the message M using the matrix H. The coded message $M_c$ is composed of two separate frames or two separate blocks 1B and 2B that may be transmitted and decoded separately and independently.

Each block is composed:
- of a first portion $1i_1$, $2i_1$ containing a respective half of the high-priority bits of the message M,
- of a second portion $1i_2$, $2i_2$ containing a respective half of the low-priority bits of the message M,
- of a third portion $1p_1$, $2p_1$ containing the parity bits associated with the first portion,
- of a fourth portion $1p_2$, $2p_2$ containing the parity bits associated with the second portion.

In FIG. 3, the notations of FIG. 4 have been reused in order to indicate, for each set, the corresponding bits of the coded message.

The coding ratio applied to the high-priority bits is higher than the coding ratio applied to the low-priority bits.

Blocks 1B and 2B may be decoded independently. The decoding may be carried out using a decoding algorithm suitable for decoding LDPC correction code, for example a belief-propagation algorithm such as described in reference [7], or any other equivalent algorithm.

The invention has a number of advantages because of the particular structure of the parity-check matrix proposed.

In the case of a transmission of the blocks 1B and 2B over a channel without error, it is possible to recover all the high-priority bits of the message M by decoding a single of the two blocks. This property makes it possible to ensure a more reliable and rapider transmission of the high-priority bits.

In the case of a transmission over a channel with errors (a radio channel for example), the decoding of a single of the two blocks 1B and 2B allows the high-priority bits to be recovered with an error probability lower than that obtained for a code defined with a parity-check matrix designed for a single priority level. Such a matrix is defined by the structure of FIG. 1 with y=0. It corresponds to a so-called root-LDPC code, such as described in reference [6].

The error-correction capacity associated with the high-priority bits is related to the ratio x/y.

In one variant embodiment of the invention, to obtain a robust system, the error-correction capacity is equivalent whatever the decoded block 1B or 2B. To obtain this result, the sub-matrices $H_1$ and $H_3$ have the same "1" density. Likewise, the sub-matrices $H_2$ and $H_4$ have the same "1" density. The sub-matrices $G_1$ and $G_2$ also have the same "1" density.

For example, the sub-matrices $H_1$, $H_2$, $H_3$, $H_4$ are quasi-cyclic parity-check matrices such as defined in [7].

Figure 5:
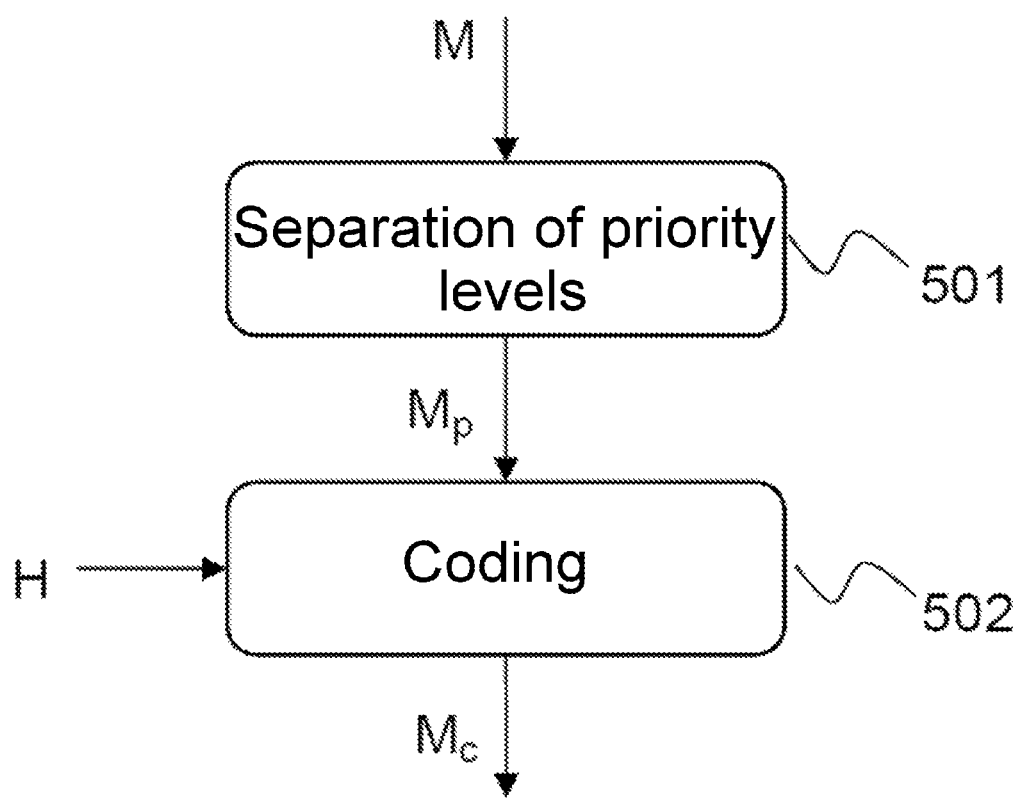
FIG. 5 shows a flowchart of a coding method according to the invention.

FIG. 5 schematically shows a flowchart of an example of a coding method according to the invention. A binary message M is received then a step 501 of separating the bits of the message depending on their priority levels is applied. Next, a coding step 502 is applied to the bits organized depending on their priority levels to generate the coded message $M_c$, which is composed of the two blocks 1B and 2B. The coding step 502 is carried out using the parity-check matrix H according to the invention.

Figure 6:
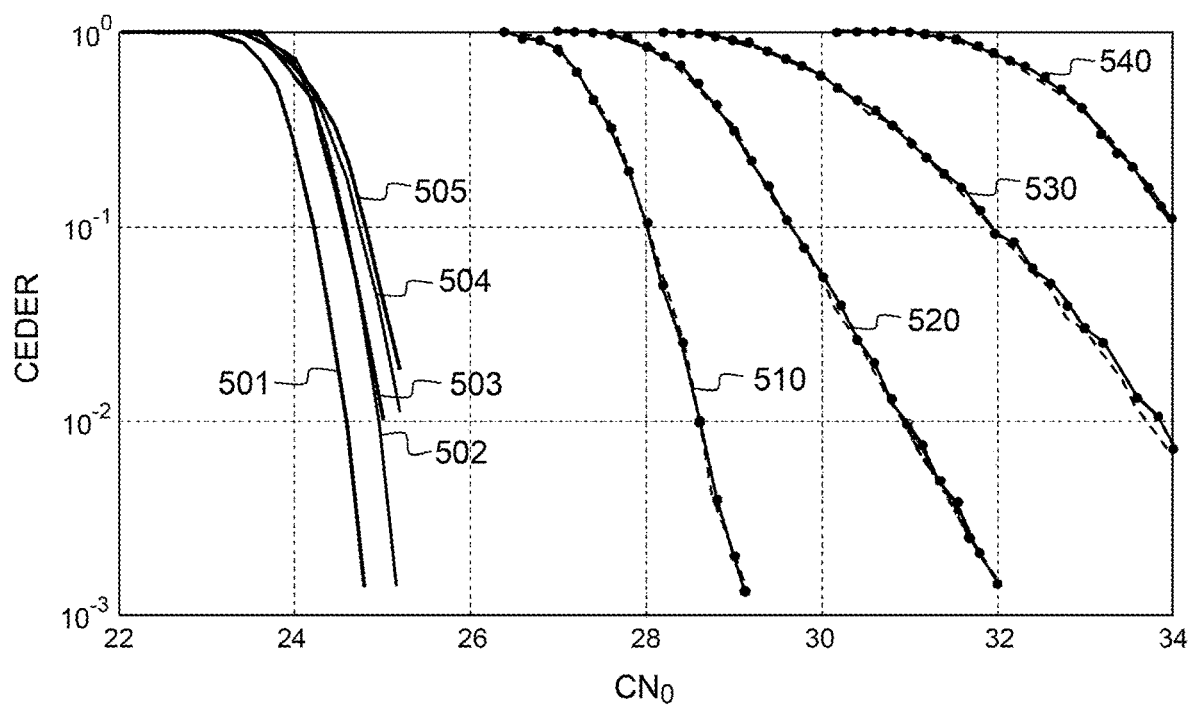
FIG. 6 shows an example of performance results obtained via the coding method according to the invention.

FIG. 6 shows, in a graph, examples of results obtained using the coding method according to invention. In this particular example, the sub-matrices $H_1$, $H_2$, $H_3$, $H_4$ are quasi-cyclic parity-check sub-matrices having a density equal to 3. The sub-matrices $G_1$ and $G_2$ have a density equal to 2.

The curves shown in FIG. 6 are curves of binary error rate as a function of the ratio of the power of the carrier to the spectral density of the noise t $C/N_0$.

Curve 501 is a curve of the probability of errors in all the decoded data bits corresponding to the LDPC code used in the data component of the GPS navigation signal L1C such as explained in reference [8].

Curves 502, 503, 504 and 505 are curves of the probability of errors in all the data bits decoded when both the blocks 1B and 2B are received and decoded.

The curve 502 corresponds to the case y=0, i.e. to coding with a single priority level. Curves 503, 504 and 505 correspond to values of x equal to 200, 100 and 50, respectively, for a value of x+y=250 in every case. The basic correction code has an efficiency of ½.

Curves 510, 520, 530 and 540 correspond to the probability of error in high-priority bits when only one of the two blocks 1B or 2B is received and decoded. The dashed curves correspond to the first block 1B and the curves with symbols correspond to the second block 2B. The curves superpose.

The curves 540 correspond to the case y=0. The curves 510, 520 and 530 correspond to values of x equal to 200, 100 and 50, respectively, for a value of x+y=250 in every case.

The proportion of high-priority bits has an influence on the probability of error in high-priority bits; the higher this proportion, the lower the probability of error.

Figure 7:
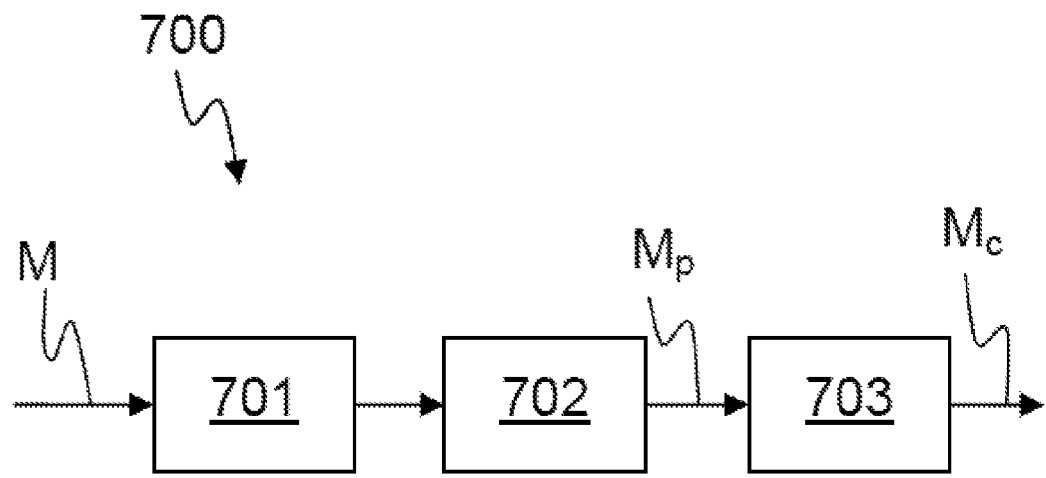
FIG. 7 shows a diagram of a differentiated-protection coder according to the invention.

FIG. 7 schematically shows a diagram of a differentiated-protection coder according to the invention, able to implement the coding method described with reference to FIG. 5.

The coder 700 according to the invention receives as input a binary message M to be coded and produces as output a coded binary message $M_c$ composed of two blocks 1B and 2B. The coder 700 comprises a first module 701 for assigning a priority level to the bits of the message M, and a second module 702 for grouping bits of same priority level together and organizing the message before coding with the expected structure. The coder 700 furthermore comprises a coding third module 703 for coding the binary message using the parity-check matrix H.

Figure 8:
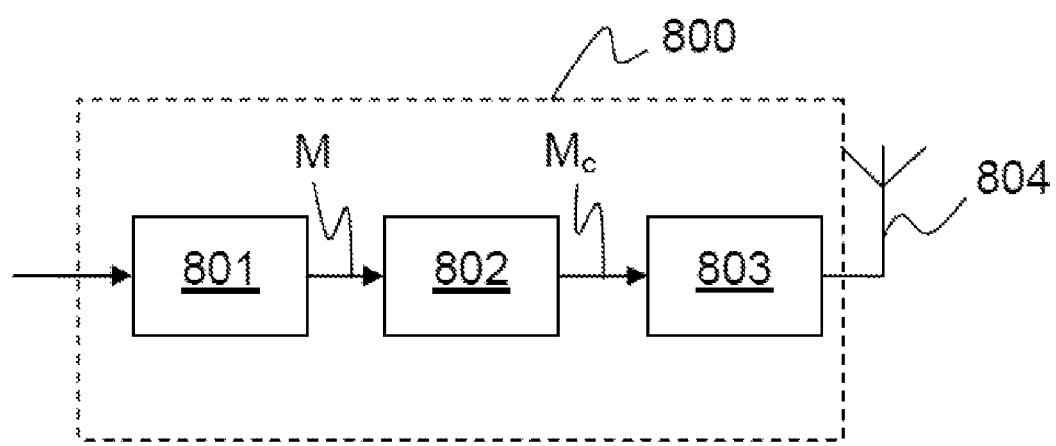
FIG. 8 shows a diagram of a transmitter comprising a differentiated-protection coder according to the invention.

FIG. 8 shows a diagram of a transmitter 800 comprising a coder 802 according to the invention. The transmitter 800 may furthermore comprise an application module 801 for generating bit frames M and a radio module 803 for modulating, filtering, forming and analoguely converting a coded bit frame $M_c$ before its transmission to an antenna 804 for emission over a radio channel. The transmitter 800 may, for example, be a transmitter compatible with a satellite radio-navigation system. In this respect, the transmitter 800 may be integrated into the payload of a satellite.

The modules of the coder and of the decoder according to the invention may be implemented using hardware and/or software components. In this respect, the invention may especially be implemented in the form of a computer program containing instructions for its execution. The computer program may be stored on a processor-readable storage medium. The medium may be electronic, magnetic, optical or electromagnetic.

In particular, the invention in its entirety or each module of the coder or of the decoder according to the invention may be implemented by a device comprising a processor and a memory. The processor may be a generic processor, a specific processor, an application-specific integrated circuit (ASIC) or a field-programmable gate array (FPGA).

The device may use one or more dedicated electronic circuits or a general-use circuit. The technique of the invention may be carried out by a reprogrammable computing machine (a processor or a microcontroller for example) executing a program comprising a sequence of instructions, or by a dedicated computing machine (for example a set of logic gates such as an FPGA or an ASIC, or any other hardware module).

According to one embodiment, the device comprises at least one computer-readable storage medium (a RAM, ROM, EEPROM, flash memory or a memory in another technology, a CD-ROM, DVD or another optical disc medium, a magnetic cassette, a magnetic strip, a magnetic storage disk, or another storage device or another computer-readable nonvolatile storage medium) coded with a computer program (i.e. a plurality of executable instructions) that, when it is executed by a processor or more than one processor, performs the functions of the embodiments of the invention described above.

By way of example of a hardware architecture suitable for implementing the invention, a device according to the invention may include a communication bus to which are connected: a central processing unit or microprocessor (CPU); a read-only memory (ROM) able to store the programs required to implement the invention; a random-access or cache memory (RAM) containing registers suitable for recording variables and parameters created and modified during the execution of the aforementioned programs; and a communication or input/output (I/O) interface suitable for transmitting and receiving data.

The reference to a computer program that, when it is executed, performs any one of the functions described above, should not be understood as being limited to an application program executed by a single host computer. On the contrary, the terms computer program and software are used here in a general sense to refer to any type of computer code (for example a piece of application software, a piece of firmware, a microcode, or any other form of computer instructions) that may be used to program one or more processors to implement aspects of the techniques described here. The computational resources or means may especially be distributed (cloud computing), optionally with peer-to-peer technologies. The software code may be executed by any suitable processor (a microprocessor for example) or processor core or a set of processors, whether they be provided in a single computing device or distributed between a plurality of computing devices (for example such as possibly accessible in the environment of the device). The executable code of each program, allowing the programmable device to implement the processes according to the invention, may be stored, for example, on a hard disk or read-only memory. Generally, the one or more programs will possibly be loaded into one of the storage means of the device before being executed. The central unit may control and direct the execution of the software code sections or instructions of the one or more programs according to the invention, which instructions are stored in the hard disk or in the read-only memory or indeed in another of the aforementioned storage components.

REFERENCES

[1] C. Poulliat, D. Declercq and I. Fijalkow, "Enhancement of Unequal Error Protection Properties of LDPC Codes", *EURASIP Journal on Wireless Communications and Networking*, vol. 2007, Article ID 92659, 9 pages, 2007.
[2] P. Pulini et al, "Unequal Diversity LDPC Codes for Relay Channels", IEEE Trans. On Wireless Communications, Vol 12, No. 11, November 2013.
[3] C. Lamy-Bergot & B. Gadat, "Embedding protection inside H.264/AVC and SVC streams", EURASIP Journal on Wireless Communications and Networking, 2010.
[4] C. Poulliat, "Contribution à l'étude et à l'optimisation de systèmes à composantes itératives", HdR 2011.
[5] FR3035286
[6] J. J. Boutros, A. Guillen i Fabregas, E. Biglieri and G. Zemor, "Low-Density Parity-Check Codes for Nonergodic Block-Fading Channels," in IEEE Transactions on Information Theory, vol. 56, no. 9, pp. 4286-4300, September 2010.
[7] Ryan, W., Lin, S. (2009). Channel Codes: Classical and Modern. Cambridge: Cambridge University Press.
[8] Marion Roudier. Analysis and Improvement of GNSS Navigation Message Demodulation Performance in Urban Environments. Theses, INP Toulouse, January 2015.

The invention claimed is:

1. A method for encoding a binary message (M) composed of a first sub-message having a first priority level and of a second sub-message having a second priority level, using an LDPC code defined by a parity-check matrix H having a first dimension corresponding to the bits of the coded binary message ($M_c$) and a second dimension, the parity-check matrix H consisting of four sub-sets ($ES_1, ES_2, ES_3, ES_4$) of two sub-matrices that are concatenated in the second dimension, the four sub-sets ($ES_1, ES_2, ES_3, ES_4$) being concatenated in the first dimension, the first sub-matrix ($J_1$) of the first sub-set ($ES_1$) taking the form

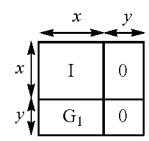

where x is equal to the size of half of the first sub-message, y is equal to the size of half of the second sub-message, I is an identity matrix of dimensions (x,x)

and $G_1$ is a nonzero matrix of dimensions (x,y), the second sub-matrix ($H_1$) of the first sub-set ($ES_1$) being a nonzero matrix, the first sub-matrix of the second sub-set ($ES_2$) being a zero matrix, the second sub-matrix ($H_2$) of the second sub-set ($ES_1$) being a nonzero matrix, the first sub-matrix ($H_3$) of the third sub-set ($ES_3$) being a nonzero matrix, the second sub-matrix ($J_2$) of the third sub-set (ES3) taking the form

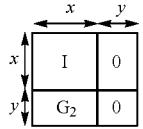

where $G_2$ is a nonzero matrix of (x,y) dimensions, the first sub-matrix ($H_4$) of the fourth sub-set ($ES_4$) being a nonzero matrix, and the second sub-matrix of the fourth sub-set ($ES_4$) being a zero matrix, the sub-matrices ($H_1$, $H_2$, $H_3$, $H_4$, $J_1$, $J_2$) of the four sub-sets been square and of dimensions (x+y,x+y), the encoding method comprising a step of encoding the binary message (M) using the parity-check matrix H to produce the coded binary message ($M_c$).

2. The method for encoding a binary message according to claim 1, wherein the coded binary message ($M_c$) is composed of two independent coded sub-messages each comprising data bits corresponding to one half of the first sub-message and to one half of the second sub-message and parity bits.

3. The method for encoding a binary message according to claim 1, wherein the first sub-set ($ES_1$) is associated with a first data-bit set consisting of a first half of the first sub-message and of a first half of the second sub-message, the second sub-set ($ES_2$) is associated with the parity bits corresponding to the first data-bit set, the third sub-set ($ES_3$) is associated with a second data-bit set consisting of a second half of the first sub-message and of a second half of the second sub-message and the fourth sub-set ($ES_4$) is associated with the parity bits corresponding to the second data-bit set.

4. The method for encoding a binary message according to claim 1, wherein the second sub-matrix ($H_2$) of the second sub-set ($ES_2$) and the first sub-matrix ($H_4$) of the fourth sub-set ($ES_4$) are of maximum rank.

5. The encoding method according to claim 1, wherein:
the second sub-matrix ($H_1$) of the first sub-set ($ES_1$) and the first sub-matrix ($H_3$) of the third sub-set ($ES_3$) have the same density of "1" values,
the second sub-matrix ($H_2$) of the second sub-set ($ES_2$) and the first sub-matrix ($H_4$) of the fourth sub-set ($ES_4$) have the same density of "1" values,
the sub-matrices $G_1$ and $G_2$ have the same density of "1" values.

6. An encoding device comprising a coder configured to execute the method for encoding a binary message according to claim 1.

7. A transmitter comprising an encoding device according to claim 6 for encoding a binary message composed of the first sub-message having a first priority level and of the second sub-message having a second priority level, in order to produce a coded binary message composed of two independent coded sub-messages each comprising data bits corresponding to half of the first sub-message and half of the second sub-message and parity bits, the transmitter comprising a transmitting means configured to transmit each of the two coded sub-messages independently.

8. A computer program containing instructions for executing the encoding method according to claim 1, when the program is executed by a processor.

9. A processor-readable storage medium on which is stored a program containing instructions for executing the encoding method according to claim 1, when the program is executed by a processor.

* * * * *